(12) United States Patent
Chen et al.

(10) Patent No.: US 11,205,562 B2
(45) Date of Patent: Dec. 21, 2021

(54) HYBRID ELECTRON BEAM AND RF PLASMA SYSTEM FOR CONTROLLED CONTENT OF RADICALS AND IONS

(71) Applicant: Tokyo Electron Limited, Tokyo (JP)

(72) Inventors: Zhiying Chen, Austin, TX (US); Peter Ventzek, Austin, TX (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 253 days.

(21) Appl. No.: 16/170,138

(22) Filed: Oct. 25, 2018

(65) Prior Publication Data

US 2020/0135432 A1 Apr. 30, 2020

(51) Int. Cl.
| | |
|---|---|
| *H01J 37/32* | (2006.01) |
| *H01L 21/3065* | (2006.01) |
| *H01L 21/67* | (2006.01) |
| *H01L 21/3213* | (2006.01) |
| *H01L 21/306* | (2006.01) |

(52) U.S. Cl.
CPC ...... *H01J 37/32422* (2013.01); *H01J 37/321* (2013.01); *H01J 37/32137* (2013.01); *H01L 21/306* (2013.01); *H01L 21/3065* (2013.01); *H01L 21/32136* (2013.01); *H01L 21/67069* (2013.01); *H01J 2237/3341* (2013.01)

(58) Field of Classification Search
None
See application file for complete search history.

(56) References Cited

U.S. PATENT DOCUMENTS

| | | | |
|---|---|---|---|
| 3,626,141 | A | 12/1971 | Daly |
| 3,789,320 | A | 1/1974 | Hepburn |

(Continued)

FOREIGN PATENT DOCUMENTS

| | | |
|---|---|---|
| DE | 4104344 A1 | 9/1991 |
| DE | 4234788 A1 | 4/1994 |

(Continued)

OTHER PUBLICATIONS

Japanese Office Action issued in counterpart patent application JP 2011-500969, dated Feb. 26, 2013.

(Continued)

*Primary Examiner* — Stephanie P Duclair
(74) *Attorney, Agent, or Firm* — Slater Matsil, LLP

(57) ABSTRACT

Embodiments of hybrid electron beam and RF plasma systems and methods are described. In an embodiment a method of using a hybrid electron beam and RF plasma system may include forming a field of electrons a first region of a wafer processing structure. Such a method may also include forming a processing plasma in a second region of the wafer processing structure, the second region of the wafer processing structure being coupled to the first region of the wafer processing structure, the processing plasma being maintained by a combination of energy from a radiant energy source and from an electron beam formed from electrons in the field of electrons. Additionally, the method may include controlling a radical composition and ions of the processing plasma by setting a ratio of the energy supplied to the processing plasma from the electron beam and the energy supplied to the processing plasma from the radiant energy source.

21 Claims, 5 Drawing Sheets

(56) References Cited

U.S. PATENT DOCUMENTS

| | | | |
|---|---|---|---|
| 4,137,988 | A | 2/1979 | Croix-Marie |
| 4,201,905 | A | 5/1980 | Clark et al. |
| 4,229,709 | A | 10/1980 | McMahan |
| 4,316,157 | A | 2/1982 | Dosi et al. |
| RE31,042 | E | 9/1982 | Clark et al. |
| 4,544,824 | A | 10/1985 | Knuttson et al. |
| 4,550,241 | A | 10/1985 | Scott et al. |
| 4,563,567 | A | 1/1986 | Geffroy et al. |
| 4,675,497 | A | 6/1987 | Pearl et al. |
| 4,878,127 | A | 10/1989 | Zollman et al. |
| 5,061,839 | A | 10/1991 | Matsuno et al. |
| 5,468,955 | A | 11/1995 | Chen et al. |
| 5,827,435 | A | 10/1998 | Samukawa |
| 6,467,922 | B1 | 10/2002 | Blanc et al. |
| 6,573,473 | B2 | 6/2003 | Hunter et al. |
| 7,371,993 | B2 | 5/2008 | Bann et al. |
| 9,520,275 | B2 | 12/2016 | Chen et al. |
| 2001/0016166 | A1 | 8/2001 | Dandl et al. |
| 2004/0207824 | A1 | 10/2004 | Lof |
| 2004/0219737 | A1 | 11/2004 | Quon |
| 2008/0149605 | A1 | 6/2008 | Sykes |
| 2010/0068415 | A1 | 3/2010 | Roca I Cabarrocas et al. |
| 2011/0177694 | A1 | 7/2011 | Chen et al. |
| 2012/0019143 | A1 | 1/2012 | Kadmoschka et al. |
| 2014/0339980 | A1* | 11/2014 | Wu ............ H01J 37/3244 315/5.13 |
| 2015/0020971 | A1* | 1/2015 | Kanarik ....... H01J 37/32146 156/345.26 |
| 2016/0064244 | A1* | 3/2016 | Agarwal ....... H01L 21/30655 438/712 |

FOREIGN PATENT DOCUMENTS

| | | |
|---|---|---|
| DE | 10200400995 A1 | 9/2005 |
| EP | 03060890 | 3/1991 |
| GB | 2400063 | 10/2004 |
| JP | 11162831 | 6/1999 |
| JP | 2001269788 | 10/2001 |
| JP | 2004-289126 | 10/2004 |
| WO | WO2004/087363 | 10/2004 |

OTHER PUBLICATIONS

Chinese Office Action issued in counterpart patent application CN 200980110185.9, dated Mar. 5, 2013.

Heason, D.J., et al., "Modifying the IEDFs at a Plasma Boundary in a low-pressure RF Discharge Using Electron Beam Injection," Institute of Physics Publishing, Plasma Sources Science and Technology, PII: S0963-0252(01)28404-7, Plasma Sources Sci. Technol. 10 (2001) pp. 627-635.

Gyergyek, T., et al., "Potential Formation in Front of an Electron Emitting Electrode Immersed in a Plasma that Contains a Monoenergetic Electron Beam," Physics of Plasmas 17, 083504 (2010).

Sydorenko, D., et al., "Excitation of Plasma Oscillators Near the Edges of a Plasma by an Intense Electron Beam in a DC Discharge," University of Alberta, Edmonton, Alberta, Canada, Princeton University, Princeton, NJ, USA, Tokyo Electron America, Austin, TX, USA, pp. 1-5.

International Bureau of WIPO, International Preliminary Report on Patentability issued in corresponding International Application No. PCT/US2014/036608, dated Dec. 17, 2015, 9 pp_.

International Search Authority, International Search Report and Written Opinion issued in corresponding PCT Application No. PCT/US2014/036608, dated Sep. 4, 2014, 11 pp.

* cited by examiner

HYBRID ELECTRON BEAM AND RF PLASMA SYSTEM FOR CONTROLLED CONTENT OF RADICALS AND IONS

FIELD OF INVENTION

The present invention relates to systems and methods for substrate processing, and more particularly to a hybrid electron beam and radio frequency (RF) plasma system and method of using the same.

BACKGROUND

Plasma has been used in semiconductor processing to assist etch processes by facilitating the removal of material along fine lines or within vias patterned on a substrate with reactive neutrals species, including radicals, and energetic ions. Etch processes use plasma including capacitively or inductively coupled plasma, hollow cathode plasma, electron cyclotron resonance plasma and microwave surface wave plasma in a manner known as reactive ion etching (RIE). For example, RIE in an inductively coupled plasma occurs when a plasma is generated using electromagnetic fields; high-energy ions are accelerated to a surface exposed to radicals to etch away unwanted materials of the substrate.

High-energy ions generated in plasma are difficult to control in RIE processes. Consequently, there are several issues associated with RIE techniques that hinder the overall performance in etching the substrate due to the lack of control of the high-energy ions. RIE plasmas have a lower limit on their electron temperature due to the means of their generation. The low electron temperature limit sets a lower limit to the ion energy at low pressure. Low energy is only obtainable with capacitive coupling, inductive coupling, or microwave coupling at high pressure. Some RIE techniques have broad ion energy distribution (IED) that results in a broad ion beam used to etch the substrate. A broad ion beam energy distribution decreases the precision required to adequately etch the substrate. Some RIE techniques have charge-induced side effects such as charge damage to the substrate.

RIE techniques may also exhibit feature-shape loading effects such as micro loading attributed to radicals. Micro loading results when an etching rate of the RIE increases due to an isolated area of the substrate. Inverse micro loading results when an etching rate of the RIE increases due to a dense area of the substrate. The increased etching rate may result in undesired profile variations between structures in dense and isolated regions of a die. The etching rate and resultant profile from an RIE technique can also vary with the aspect ratio of the via or line being fabricated. RIE techniques may also exhibit feature-shape loading effects such as micro loading attributed to radicals.

Further issues arise with the inclusion of plasma chemistries designed to create radicals in the plasma. For example, in such systems it may be difficult to control electron density and electron temperature of the etch plasma. The inability to control the electron temperature or inability to create a low electron temperature plasma (<1 eV to <3 eV) makes it difficult to generate certain species that require such low electron temperatures. Dissociative electron attachment (the production of a negative ion and a radical: $e + HBr \rightarrow H + Br-$) can require ~1 eV to be productive.

Some attempts to solve the technical problems described above have been made, such as the systems and methods described in U.S. Pat. No. 9,520,275 to Chen, entitled "Mono-Energetic Neutral Beam Activated Chemical Processing System and Method of Using," issued on Dec. 13, 2016 and resulting from U.S. patent application Ser. No. 12/053,008 filed on Mar. 21, 2008, and U.S. Patent App. Pub. No. 2014/0360670 of Chen et. al, entitled "Processing System for Non-Ambipolar Electron Plasma (NEP) Treatment of a Substrate With Sheath Potential," published on Dec. 11, 2014 and resulting from U.S. patent application Ser. No. 14/026,092 filed on Sep. 13, 2013, which are incorporated herein in entirety.

The methods and systems described by Chen in the documents cited above include formation of a first plasma in a first region and formation of a second plasma in a second region. In some systems, the first region and the second region are regions in a single processing chamber. In other systems, the first region and second region are separate chambers coupled by a means of coupling the first plasma and the second plasma. In the described methods, electrons from the first plasma provide energy required to ignite and/or maintain the second plasma. In such systems, the workpiece is electrically floating and the beam generation region is grounded. As described below, the methods and systems described herein present a technical improvement on the systems described in Chen and Chen et. al.

SUMMARY OF THE INVENTION

Embodiments of hybrid electron beam and RF plasma systems and methods are described. In an embodiment a method of using a hybrid electron beam and RF plasma system may include forming a field of electrons a first region of a wafer processing structure. Such a method may also include forming a processing plasma in a second region of the wafer processing structure, the second region of the wafer processing structure being coupled to the first region of the wafer processing structure, the processing plasma being maintained by a combination of energy from a radiant energy source and from an electron beam formed from electrons in the field of electrons. Additionally, the method may include controlling a radical composition of the processing plasma by setting a ratio of the energy supplied to the processing plasma from the electron beam and the energy supplied to the processing plasma from the radiant energy source.

One embodiment of a system may include a wafer processing structure having a first region configured to form a field of electrons, and a second region coupled to the first region, the second region configured to form a processing plasma in a second region of the wafer processing structure, the second region of the wafer processing structure being coupled to the first region of the wafer processing structure, the processing plasma being maintained by a combination of energy from a radiant energy source and from an electron beam formed from electrons in the field of electrons. In an embodiment, the system may also include a controller configured to control a radical composition of the processing plasma by setting a ratio of the energy supplied to the processing plasma from the electron beam and the energy supplied to the processing plasma from the radiant energy source.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION

Figure 1:
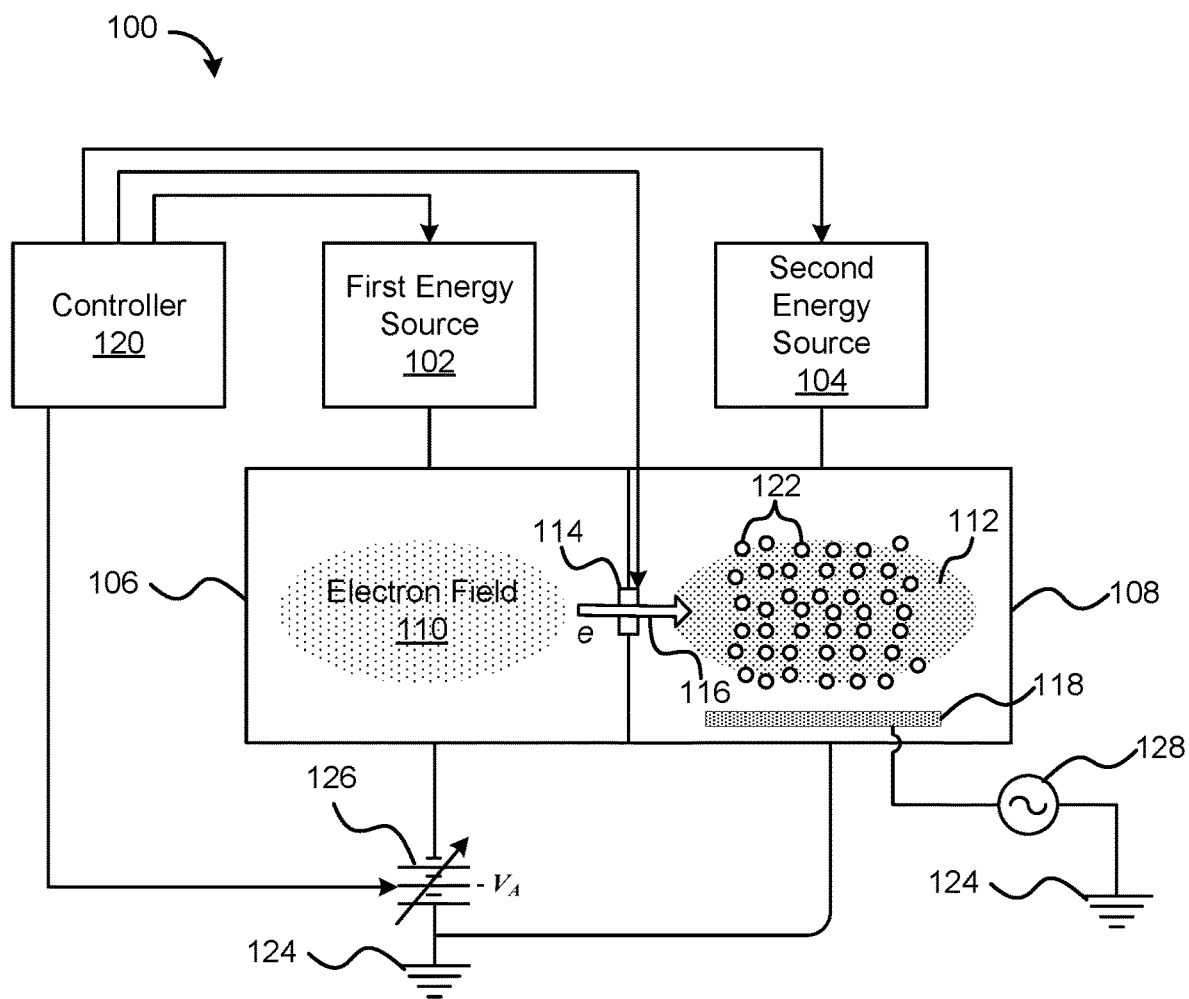
FIG. 1 illustrates one embodiment of a system for generating a hybrid electron beam and RF plasma.

Methods and systems for controlling plasma performance are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Referring now to the drawings, where like reference numerals designate identical or corresponding parts throughout the several views.

FIG. 1 illustrates one embodiment of a system 100 for generating a hybrid plasma formed from energy from an electron beam energy source and an RF energy source. In an embodiment, the system 100 may include a first energy source 102 and a second energy source 104. The first energy source 102 may be coupled to a first region 106 of a wafer processing structure and the second energy source 104 may be coupled to a second region 108 of the wafer processing structure. In an embodiment, the wafer processing structure may include a single plasma processing chamber having two distinct regions corresponding to the first region 106 and the second region 108. Alternatively, the wafer processing structure may include a plurality of separate processing chambers defining the first region 106 and the second region 108 respectively.

In such embodiments, the first region 106 and the second region 108 may be communicatively coupled together via one or more channels 114. A channel 114 may be a conduit through, or an aperture in, one or more sidewalls defining the first region 106 and the second region 108. In one embodiment, a single channel 114 is defined. In another embodiment a plurality of channels 114 are defined. In an embodiment, the size of the channel 114 may be variable. In another embodiment, a number of channels 114 may be variable. In another embodiment, the shape of the channel 114 is variable. In still a further embodiment, the channel structure is static, but one or more electric characteristics of the electron field 110 is variable, through control of the first energy source 102. Additionally, the characteristics of the electron field 110 may be variable in response to changes in chamber pressure, chamber gas chemistries, etc.

As illustrated, the first energy source 102 may generate a field of electrons 110. In one such embodiment, the first energy source 102 may generate the field of electrons 110 by igniting and maintaining a first plasma. The first plasma may be an electron rich plasma. In one embodiment, the first energy source 102 may be an inductively coupled plasma (ICP) energy source. The ICP energy source may include a power generator and an antenna configured for ICP plasma generation. Alternatively, the first energy source is a transformer coupled plasma (TCP) energy source. In another embodiment, the first energy source 102 may be a hollow cathode plasma source. In further embodiments, the electrons for forming the electron beam 116 may be generated by a filament or any other suitable electron source that may be known or become known to one of ordinary skill in the art. In other embodiments, the first energy source 102 may be configured to generate energy in the microwave frequency range.

In an embodiment, the second energy source 104 may ignite the processing plasma 112 and the electron beam 116 may be configured to modulate one or more characteristics of the processing plasma 112. In an alternative embodiment, the processing plasma 112 may be ignited by energy from the electron beam 116, and the second energy source 104 may provide energy for maintaining the processing plasma 112, where the ratio of the energy from the electron beam 116 and the energy from the second energy source 104 may be controlled to modulate one or more characteristics of the processing plasma 112. In still another embodiment, the processing plasma 112 may be both ignited and maintained by the electron beam 116, and the second energy source 104 may provide energy for modulating one or more characteristics of the processing plasma 112. The second energy source 104 may include one or more types of RF or microwave plasma sources, including a surface wave energy source, an ICP source, an electron cyclotron resonance (ECR) source, or a capacitively coupled plasma (CCP) source.

In an embodiment, electrons from the electron field 110 may be directed to the processing plasma 112 via a channel 114. In an embodiment, the channel 114 may form an electron beam 116 that is directed into the processing plasma 112. In an embodiment, the electron beam 116 may modulate one or more characteristics of the processing plasma 112. Specifically, the electron beam 116 may modulate the electron energy distribution function in the processing plasma 112. In another embodiment, the electron beam 116 may ignite the processing plasma 112, and the second energy source 104 may modulate one or more characteristics of the processing plasma 112.

In further embodiments, the controller 120 may control at least one of the first energy source 102, the second energy source 104, or the channel 114 to modulate a concentration of radicals 122 in the processing plasma 112. Additional embodiments may allow the controller 120 to control the electron temperature of the processing plasma 112. In one such embodiment, the controller 120 may be configured to generate a processing plasma 112 that has a flexible radical composition with a low electron temperature and a high plasma density. Further details of such a system are described with relation to FIGS. 4-5.

In an embodiment, the system 100 includes one or more components for supply electric energy to portions of the system 100 and for electrically grounding one or more components. In such an embodiment, the system 100 includes a connection to electrical ground 124 and an electric potential source 126. In one embodiment, the first region 106 may be electrically floated with respect to ground 124. In an embodiment, the electric potential source 126 may be coupled to the first region 106 and apply a negative electric potential to one or more components of the first region 106. In one embodiment, the electric potential source 126 may apply a negative electric potential to a surface of a plasma chamber defining the first region 106. In addition, at least a portion of the second region 108 may be electrically grounded by the electrical ground 124. In an embodiment, a surface of a plasma chamber defining the second region 108 may be coupled to the electrical ground 124. In an embodiment, the wafer 118 may be coupled to a bias source 128. In an embodiment, the bias source 128 may be configured to supply RF power, pulsed RF power, DC power, or pulsed DC power to accelerate ions to the surface of the wafer 118 from the plasma 112.

In such embodiments, the negative electric potential applied to the first region 106 and the ground applied to the second region 108 may facilitate directing the electron beam 116 through the channel 114 and into the processing plasma 112. In a further embodiment, such an arrangement may enhance one or more performance parameters of the processing plasma 112 in a region proximate to the workpiece 118. The workpiece 118 may be, in an embodiment, a semiconductor wafer to be processed in the system 100.

In a further embodiment, the electron beam 116 may reduce the electron temperature of the processing plasma 112 and increase the plasma density of the processing plasma 112, which may tune an ion-to-radical flux ratio, radical distribution, neutral dissociation degree, and the like. In such embodiments, the electron beam 116 may further energize the radicals 122 in the processing plasma 112, thereby increasing the radical reactivity. In such an embodiment, the electron beam 116 may ionize or dissociate the radicals; however at high beam energies (e.g. 500 eV or more), the ionization or dissociative ionization probability is much higher than the dissociation probability. Accordingly, the beam electrons may primarily produce ions and the secondary "child" electrons produce radicals or negative ions through dissociation. The electron beam 116 may be able to reduce the electron temperature even at low pressure. Low pressure and short residence time are important so that etch by-products can be eliminated from the second region 104 and minimize cross-reactions between dissociation products, such as generated radicals. Beneficially, such embodiments may produce a very clean etch process, having relatively little byproduct, as a result of the low electron temperature ($T_e$) and low pressure.

Figure 2:
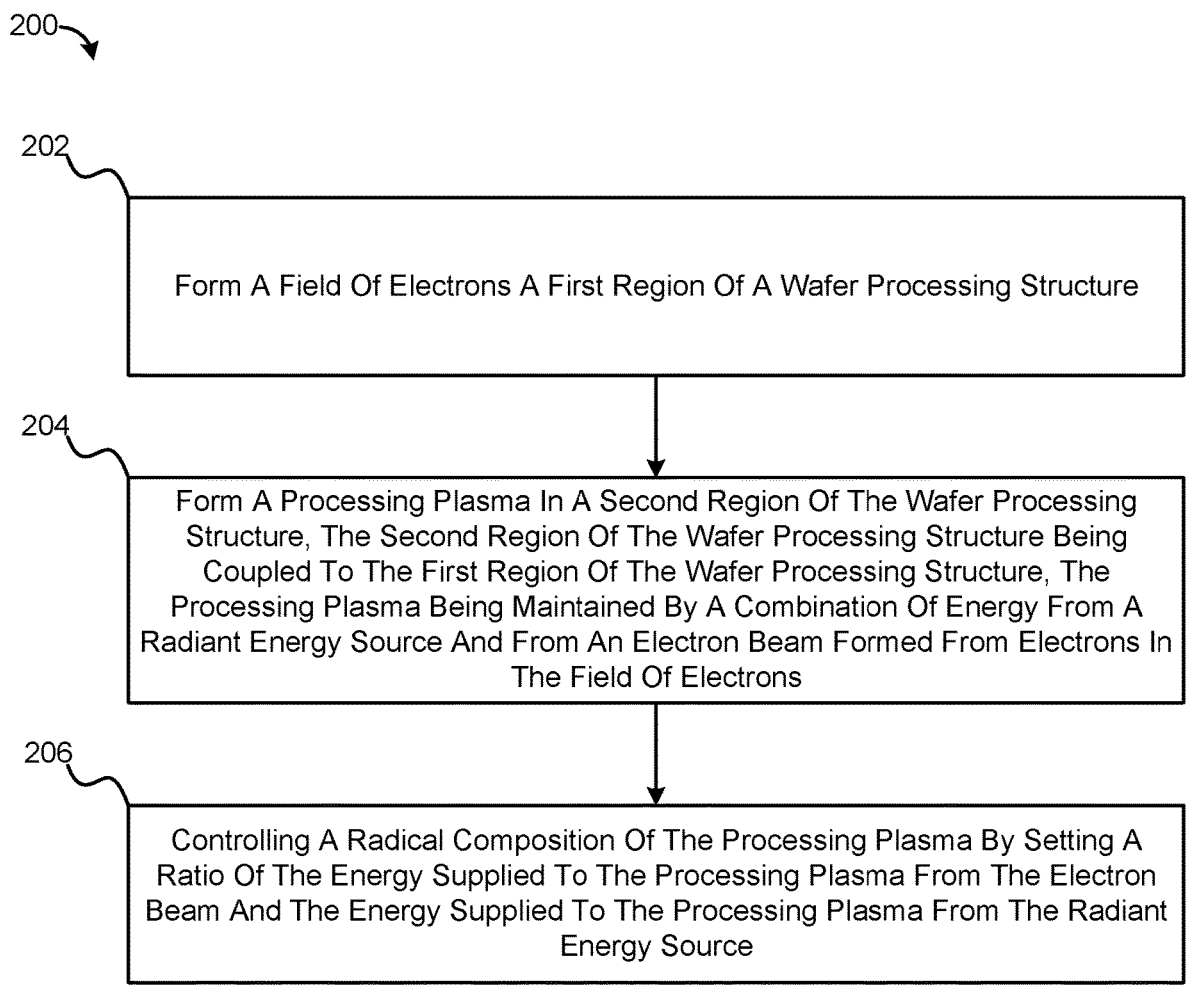
FIG. 2 illustrates one embodiment of a method for generating a hybrid electron beam and RF plasma.

FIG. 2 illustrates an embodiment of a method 200 of using a hybrid electron beam and RF plasma system 100. In one embodiment, the method 200 may include forming a field of electrons a first region of a wafer processing structure, as shown at block 202. Additionally, such a method 200 may include forming a processing plasma in a second region of the wafer processing structure, the second region of the wafer processing structure being coupled to the first region of the wafer processing structure, the processing plasma being maintained by a combination of energy from a radiant energy source and from an electron beam formed from electrons in the field of electrons as shown at block 204. In an embodiment, the method 200 also includes controlling a radical composition of the processing plasma by setting a ratio of the energy supplied to the processing plasma from the electron beam and the energy supplied to the processing plasma from the radiant energy source, as shown at block 206.

Figure 3:
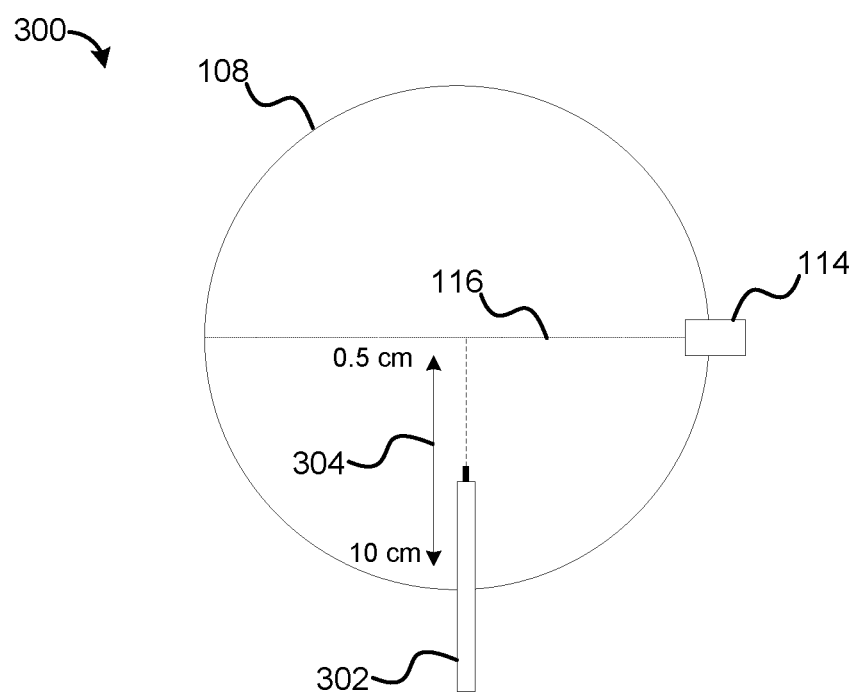
FIG. 3 illustrates one embodiment of an apparatus for measuring a hybrid electron beam and RF plasma.

FIG. 3 illustrates an embodiment of a testbed 300 for measurement of performance of the system 100 described in FIG. 1. The testbed 300 was used in experimental testing of the system 100 to generate data represented in FIGS. 4A-5B. In an embodiment, a test probe 302 was introduced into the second region 108. In some embodiments, the second region 108 is a plasma processing chamber in which the processing plasma is generated. The test probe 302 may be introduced through a sidewall of the processing chamber into the second region 108. The test probe 302 may be inserted into the second region 108 at a variable distance 304 from the electron beam 116, which enters the second region through the channel 114. In some tests, the test probe 302 is inserted directly in-line with the electron beam 116. In some tests, the test probe 302 is inserted at a position along a line parallel to the electron beam 116, but not directly in-line with the electron beam 116. For example, the variable distance from the test probe 302 to the electron beam 116 may be in a range of 0.5 cm to 10 cm.

Figure 4:
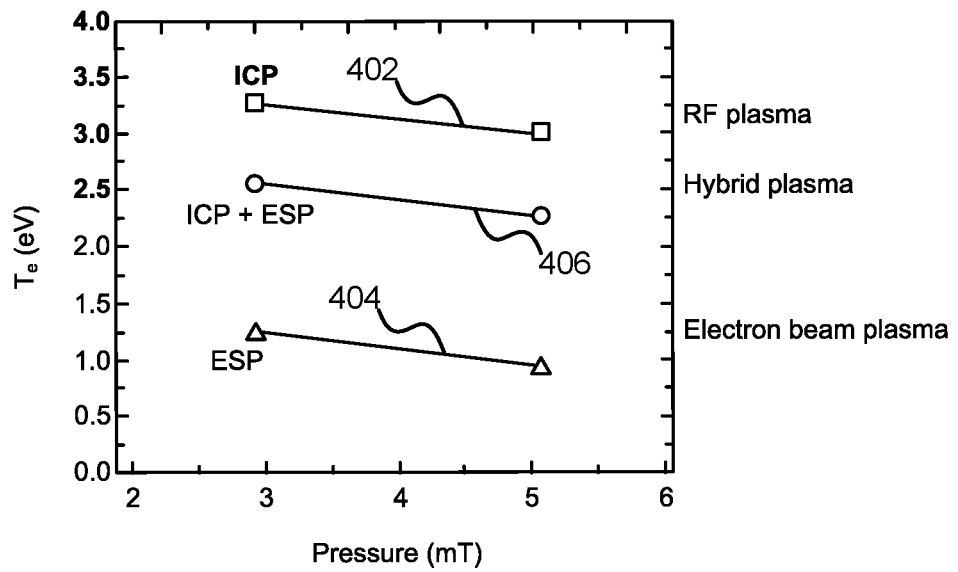
FIG. 4 is a diagram illustrating electron temperature of an embodiment of a hybrid electron beam and RF plasma.
Figure 5:
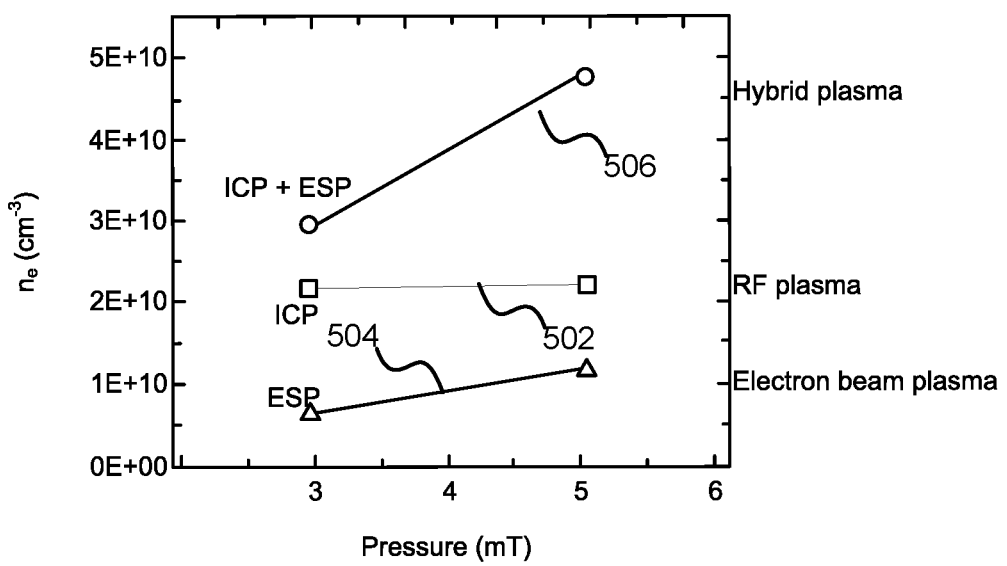
FIG. 5 is a diagram illustrating plasma density of an embodiment of a hybrid electron beam and RF plasma.

FIGS. 4-5 illustrate a response and tunability of characteristics of the processing plasma 112. FIG. 4 represents data acquired during testing of an embodiment of the system 100 described in FIG. 1 at a plasma chamber pressure of in a range of 2 mTorr to 6 mTorr. In the described embodiment, the test probe 302 of FIG. 3 is used. The data illustrated in FIG. 4 was acquired using an ICP RF plasma source as illustrated by curve 402.

The RF plasma curve 402 represents data acquired from a processing plasma 112, wherein the processing plasma 112 is ignited and maintained by an RF source alone. The electron beam plasma curve 404 represents data acquired from a processing plasma 112, wherein the processing plasma 112 is maintained by energy from the electron beam 116 alone. Hybrid plasma curve 406 represents data acquired from a processing plasma 112, wherein the processing plasma 112 is maintained by a combination of RF energy from the second energy source 104 and energy from the electron beam 116. As shown, the RF plasma curve 402 represents an upper boundary and the electron beam plasma curve 404 represents a lower boundary, and the hybrid plasma curve 406 falls between the two. In various embodiments, the electron temperature of the hybrid plasma is tunable between the upper boundary and the lower boundary through modulation of the energy supplied by the electron beam 116.

Similarly, the plasma density response is tunable as shown in FIG. 5. In such an embodiment, the plasma density of RF plasma is represented by RF plasma density curve 502, and electron beam plasma density is represented by electron beam plasma density curve 504. In such an embodiment, the hybrid plasma density curve 506 shows that the RF plasma density and electron beam plasma density is additive. Thus, an increase of energy from the electron beam 116 will increase plasma density of the hybrid plasma. As shown in FIGS. 4-5, the tunability of electron temperature and plasma density may be affected by the pressure in the second region 104.

Figure 6A:
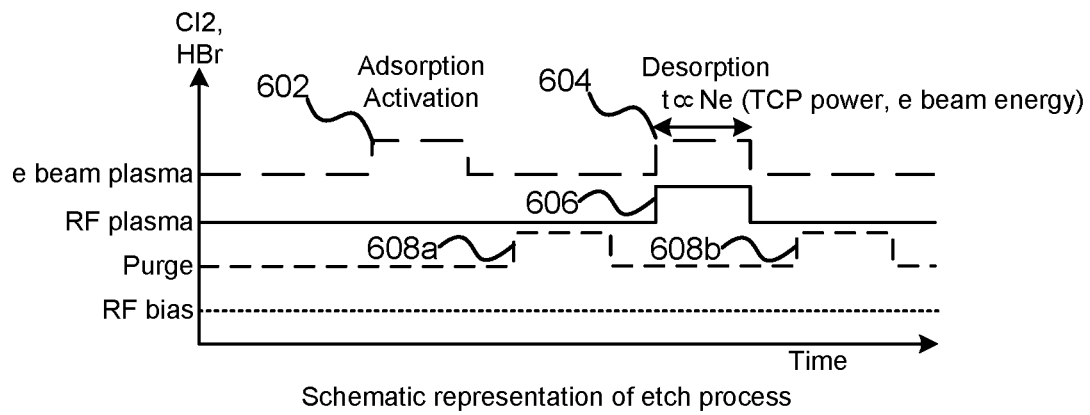
FIG. 6A is a timing diagram illustrating one embodiment of a sequential etch process using an embodiment of a hybrid electron beam and RF plasma.
Figure 6B:
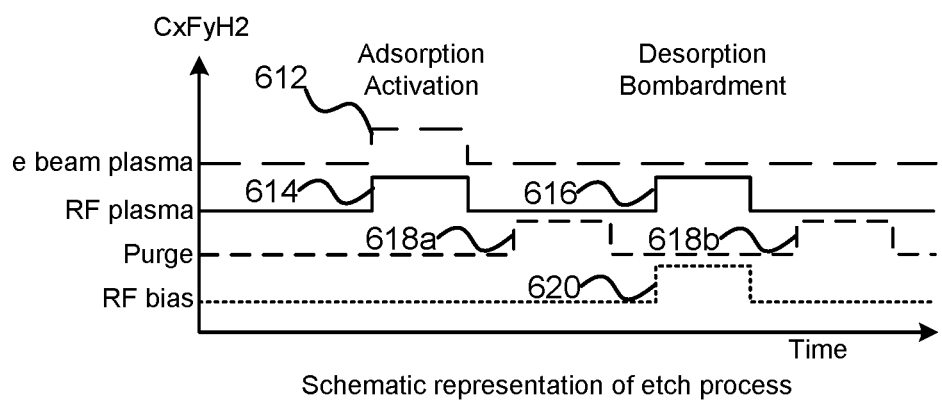
FIG. 6B is a timing diagram illustrating one embodiment of a sequential etch process using an embodiment of a hybrid electron beam and RF plasma.
Figure 6C:
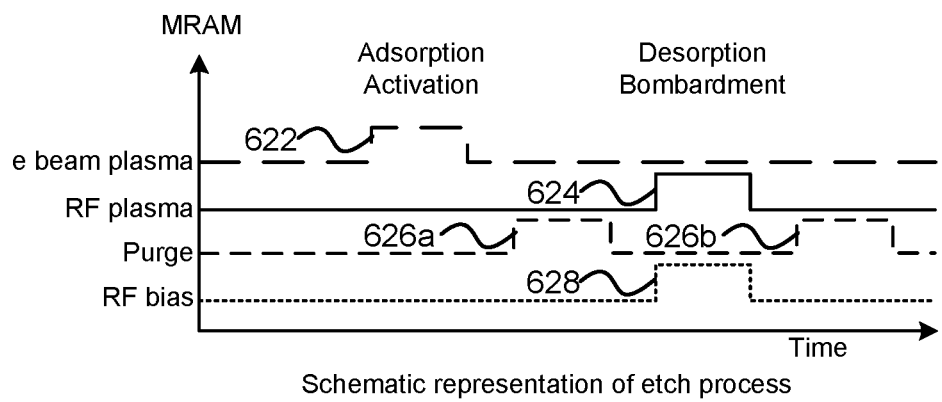
FIG. 6C is a timing diagram illustrating one embodiment of a sequential etch process using an embodiment of a hybrid electron beam and RF plasma

FIGS. 6A-6C illustrate various embodiments of etch process sequences which may be performed according to the systems and methods of the present embodiments. FIG. 6A illustrates an embodiment of an etch process that may be performed using an etch chemistry that includes $Cl_2$ and HBr gasses. Each line on the graph represents activation or deactivation of the labeled processing step. Steps in each line represent events in the processing flow. For example, in FIG. 6A, at event 602 the processing plasma 112 is applied using an electron beam 116. At events 604 and 606, the energy from the electron beam 116 and the second energy source 104 are applied substantially simultaneously to form a hybrid plasma. Purge events 608a-608b may be performed between etch steps to clear the chamber and/or remove contaminants from the surface of the workpiece 118. Although this described embodiment may not require a separate desorption/bombardment process using a bias source because the energy associated with the atomic layer etching is so low, in other embodiments where different materials or etch processes are used, the desorption/bombardment process using, for example, bias source 128 may be used. For example, such a process is described with relation to FIG. 6B.

An alternative embodiment is illustrated in FIG. 6B, wherein an etch chemistry that includes a variety of $C_xF_yH_2$ gas. In such an embodiment, the adsorption/activation step is performed by applying energy from both the electron beam 116 and the second energy source 104 substantially simultaneously, as shown by events 612 and 614. A desorption/bombardment process may be performed with a plasma having energy from the second energy source 104 alone as shown at event 616. In an embodiment, an RF bias may be applied to the workpiece 118 at the same time, as shown at event 620. Purge events 618a-618b are similarly used to clear and/or remove contaminants.

The embodiment of FIG. 6C utilizes an etch chemistry suitable for production of magnetoresistive random-access memory (MRAM). In such an embodiment, the absorption/activation process may be performed by applying energy from the electron beam 116 to the processing plasma 112 as shown at event 622. The desorption/bombardment process may be performed by applying energy from the second energy source 104, without energy from the electron beam as shown at event 624. In an embodiment, the RF bias may also be applied to the workpiece 118 using the negative bias source 124, as shown at event 628. The purge steps 626a-626b may occur between absorption and desorption processes.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What we claim:

1. A method for plasma processing of a substrate, comprising:
    forming a field of electrons in a first region within a first chamber of a wafer processing structure; and
    forming a processing plasma in a second region within a second chamber of the wafer processing structure, the second region of the wafer processing structure being coupled to the first region of the wafer processing structure, the second chamber being configured to support the substrate during an exposure to the processing plasma, the processing plasma being maintained by a combination of energy from a radiant energy source and from an electron beam formed from electrons in the field of electrons;
    controlling a radical composition of the processing plasma by setting a ratio of the energy supplied to the processing plasma from the electron beam and the energy supplied to the processing plasma from the radiant energy source; and
    controlling a plasma density of the processing plasma by setting the ratio of the energy supplied to the processing plasma from the electron beam and the energy supplied to the processing plasma from the radiant energy source, wherein controlling the radical composition and controlling the plasma density of the processing plasma comprises injecting the electron beam from the first region within the first chamber into the second region within the second chamber.

2. The method of claim 1, wherein the ratio of the energy controls an electron temperature of the processing plasma.

3. The method of claim 2, further comprising setting the ratio of the energy to a setting that causes the electron temperature of the processing plasma to be lower than the electron temperature is when the energy from the electron beam is not applied.

4. The method of claim 1, further comprising setting the ratio of the energy to a setting that causes the plasma density of the processing plasma to be higher than the plasma density is when the energy from the electron beam is not applied.

5. The method of claim 1, wherein forming the field of electrons further comprises forming an electron-rich plasma in the first region.

6. The method of claim 1, further comprising applying a negative electric potential to the first region of the wafer processing structure or grounding the first region of the wafer processing structure.

7. The method of claim 1, further comprising intermittently introducing the energy supplied by the electron beam to the processing plasma, and intermittently introducing the energy supplied by the radiant energy source to the processing plasma.

8. The method of claim 1, wherein the first region is coupled to the second region with a conduit through a sidewall of the first chamber and a sidewall of the second chamber, and wherein the electron beam is injected into the second region through the conduit.

9. A method for plasma processing of a substrate, comprising:
having a processing system comprising a first chamber and a second chamber;
providing a wafer within the second chamber;
forming a first plasma in a first chamber;
forming a second plasma in the second chamber, the first plasma being electron rich relative to the second plasma;
at a first instance exposing the wafer to the second plasma by, powering the first plasma by applying a first energy source to the first chamber to inject electrons from the first chamber into the second plasma through a channel connecting the first chamber from the second chamber; and
at a second instance exposing the wafer to the second plasma by, powering the second plasma by applying a radio frequency (RF) pulse to the second chamber from a second energy source.

10. The method of claim 9, wherein the first instance and the second instance overlap in time.

11. The method of claim 10, further comprising:
at a third instance before the first instance, performing an adsorption process by powering the first plasma with the first energy source to inject further electrons from the first chamber into the second plasma through the channel; and
performing a purging process after performing the adsorption process.

12. The method of claim 10, further comprising:
at a third instance after the first instance and after the second instance, powering the second plasma by applying another RF pulse from the second energy source and applying a RF bias pulse to the wafer.

13. The method of claim 9, further comprising:
at the second instance, applying a RF bias pulse to the wafer.

14. The method of claim 9, further comprising:
purging the second chamber between the first instance and the second instance.

15. The method of claim 9, further comprising:
purging the second chamber after the first instance and after the second instance.

16. The method of claim 9, further comprising:
at a third instance, powering the first plasma with the first energy source to inject further electrons from the first chamber into the second plasma through the channel.

17. The method of claim 9, further comprising:
at the second instance, applying a RF bias pulse to the wafer.

18. A method for plasma processing of a substrate, comprising:
having a processing system comprising a first chamber and a second chamber, the processing system comprising a channel disposed between the first chamber and the second chamber, the channel connecting the first chamber to the second chamber;
loading a wafer within the second chamber;
performing an adsorption step on the wafer by directing an electron beam from the first chamber into a processing plasma in the second chamber, the electron beam being generated from an electron field powered with a first energy source in the first chamber; and
performing a desorption step on the wafer by powering the processing plasma in the second chamber with a radio frequency (RF) energy source coupled to the second chamber, wherein the first energy source, the RF energy source, and the channel are controlled by a controller to perform the adsorption step and the desorption step.

19. The method of claim 18, wherein each of the adsorption and the desorption steps comprise exposing the wafer to a gas comprising $Cl_2$ and HBr, and wherein the plasma during the desorption step is further powered by the first energy source.

20. The method of claim 18, wherein each of the adsorption and the desorption steps comprise exposing the wafer to a gas comprising fluorohydrocarbon ($C_xF_yH_2$), and wherein the plasma during the adsorption step is further powered by the RF energy source.

21. The method of claim 18, further comprising:
at the desorption step, applying a RF bias pulse to the wafer.

* * * * *